United States Patent
Odnoblyudov et al.

(10) Patent No.: US 10,204,778 B2
(45) Date of Patent: Feb. 12, 2019

(54) METHOD AND SYSTEM FOR VERTICAL POWER DEVICES

(71) Applicant: QROMIS, Inc., Santa Clara, CA (US)

(72) Inventors: Vladimir Odnoblyudov, Danville, CA (US); Dilip Risbud, San Jose, CA (US); Ozgur Aktas, Pleasanton, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/847,716

(22) Filed: Dec. 19, 2017

(65) Prior Publication Data

US 2018/0182620 A1 Jun. 28, 2018

Related U.S. Application Data

(60) Provisional application No. 62/439,860, filed on Dec. 28, 2016.

(51) Int. Cl.
| | | |
|---|---|---|
| *H01L 21/02* | (2006.01) | |
| *H01L 21/683* | (2006.01) | |

(Continued)

(52) U.S. Cl.
CPC .... *H01L 21/02505* (2013.01); *H01L 21/0242* (2013.01); *H01L 21/0243* (2013.01); *H01L 21/0245* (2013.01); *H01L 21/0254* (2013.01); *H01L 21/02389* (2013.01); *H01L 21/02488* (2013.01); *H01L 21/02516* (2013.01); *H01L 21/6831* (2013.01); *H01L 21/7806* (2013.01);

(Continued)

(58) Field of Classification Search
CPC ........... H01L 21/02505; H01L 21/0243; H01L 21/02516; H01L 21/02488; H01L 21/0242; H01L 21/0254; H01L 21/0245; H01L 21/02389; H01L 29/66712; H01L 29/66522; H01L 21/7806; H01L 29/66212; H01L 21/6813; H01L 21/02378
See application file for complete search history.

(56) References Cited

U.S. PATENT DOCUMENTS

2006/0284247 A1   12/2006   Augustine et al.
2009/0243026 A1   10/2009   Nakamura et al.
(Continued)

OTHER PUBLICATIONS

International Search Report with Written Opinion of the International Searching Authority dated May 4, 2018 (13 pages).

*Primary Examiner* — William Coleman
(74) *Attorney, Agent, or Firm* — Kilpatrick Townsend & Stockton LLP

(57) ABSTRACT

A method of forming a semiconductor device includes providing an engineered substrate. The engineered substrate includes a polycrystalline ceramic core, a barrier layer encapsulating the polycrystalline ceramic core, a bonding layer coupled to the barrier layer, and a substantially single crystalline silicon layer coupled to the bonding layer. The method further includes forming a Schottky diode coupled to the engineered substrate. The Schottky diode has a top surface and a bottom surface. The bottom surface is coupled to the substantially single crystalline silicon layer. The method further includes forming a Schottky contact coupled to the top surface of the Schottky diode, forming a metal plating coupled to the Schottky contact, removing the engineered substrate to expose the bottom surface of the Schottky diode, and forming an ohmic contact on the bottom surface of the Schottky diode.

20 Claims, 12 Drawing Sheets

(51) Int. Cl.
    *H01L 29/66*    (2006.01)
    *H01L 21/78*    (2006.01)
(52) U.S. Cl.
    CPC .. *H01L 29/66212* (2013.01); *H01L 29/66522* (2013.01); *H01L 29/66712* (2013.01); *H01L 21/02378* (2013.01)

(56)    References Cited

U.S. PATENT DOCUMENTS

2014/0183442  A1    7/2014  Odnoblyudov et al.
2015/0001547  A1    1/2015  Hikosaka et al.

METHOD AND SYSTEM FOR VERTICAL POWER DEVICES

CROSS-REFERENCES TO RELATED APPLICATIONS

This application claims the benefit of U.S. Provisional Patent Application No. 62/439,860, filed on Dec. 28, 2016, the disclosure of which is incorporated by reference in its entirety.

BACKGROUND OF THE INVENTION

Gallium nitride based power devices are typically epitaxially grown on sapphire substrates. The growth of gallium nitride based power devices on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

According to an embodiment of the present invention, a method of forming a semiconductor device includes providing an engineered substrate. The engineered substrate includes a polycrystalline ceramic core, a barrier layer encapsulating the polycrystalline ceramic core, a bonding layer coupled to the barrier layer, and a substantially single crystalline silicon layer coupled to the bonding layer. The method further includes forming a Schottky diode coupled to the engineered substrate. The Schottky diode has a top surface and a bottom surface. the bottom surface is coupled to the substantially single crystalline silicon layer. The method further includes forming a Schottky contact coupled to the top surface of the Schottky diode, forming a metal plating coupled to the Schottky contact, removing the engineered substrate to expose the bottom surface of the Schottky diode, and forming an ohmic contact on the bottom surface of the Schottky diode. In some embodiments, forming the Schottky diode includes forming a first epitaxial N-type gallium nitride layer coupled to the substantially single crystalline silicon layer, and forming a second epitaxial N-type gallium nitride layer coupled to the first epitaxial N-type gallium nitride layer. The Schottky contact is coupled to the second epitaxial N-type gallium nitride layer, and the ohmic contact is coupled to the first epitaxial N-type gallium nitride layer.

According to another embodiment of the present invention, a method of forming a semiconductor device includes providing an engineered substrate. The engineered substrate includes a polycrystalline ceramic core, a barrier layer encapsulating the polycrystalline ceramic core, a bonding layer coupled to the barrier layer, and a substantially single crystalline silicon layer coupled to the bonding layer. The method further includes forming a buffer layer coupled to the substantially single crystalline silicon layer, and forming a power transistor coupled to the buffer layer. The power transistor has a top surface and a bottom surface. The bottom surface is coupled to the buffer layer. The method further includes forming a gate contact coupled to top surface of the power transistor, forming a first source contact and a second source contact coupled to the top surface of the power transistor, removing the engineered substrate, removing the buffer layer to expose the bottom surface of the power transistor, and forming a drain contact coupled to the bottom surface of the power transistor. In some embodiment, forming the power transistor includes forming a first epitaxial N-type gallium nitride layer coupled to the buffer layer, forming a second epitaxial N-type gallium nitride layer coupled to the first epitaxial N-type gallium nitride layer, and forming a first P-type gallium nitride region and a second P-type gallium nitride region within the second epitaxial N-type gallium nitride layer. The first P-type gallium nitride region and the second P-type gallium nitride region are separated from each other by a trench. A portion of the second epitaxial N-type gallium nitride layer above the trench forms a channel region. Forming the power transistor further includes forming an epitaxial aluminum gallium nitride layer coupled to the channel region, and forming a gate dielectric layer coupled to the epitaxial aluminum gallium nitride layer. the gate contact is coupled to the gate dielectric layer, the first source contact is coupled to the first P-type gallium nitride region, the second source contact is coupled to the second P-type gallium nitride region, and the drain contact is coupled to the back surface of the first epitaxial N-type gallium nitride layer.

DETAILED DESCRIPTION OF SPECIFIC EMBODIMENTS

The present invention relates generally to Schottky diodes and power transistors formed on engineered substrates. More specifically, the present invention relates to methods and systems suitable for fabricating vertical Schottky diodes and vertical power transistors using epitaxial growth processes. Merely by way of example, the invention has been applied to a method and system for fabricating vertical Schottky diodes and vertical power transistors on a substrate by epitaxial growth, wherein the substrate is characterized by a coefficient of thermal expansion (CTE) that is substantially matched to epitaxial layers that form the vertical Schottky diodes and vertical power transistors. The methods and techniques can be applied to a variety of semiconductor processing operations.

Figure 1:
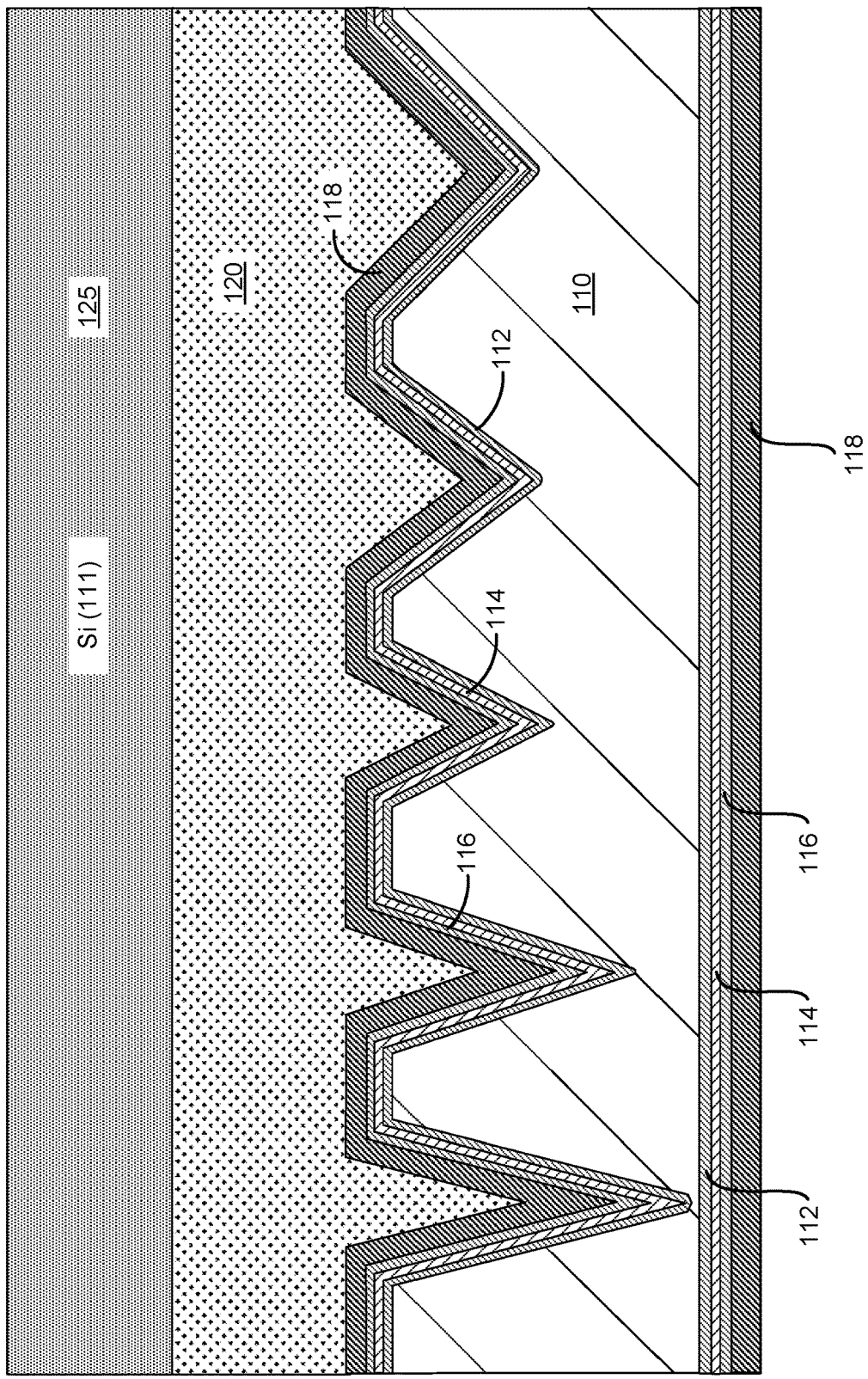
FIG. 1 is a simplified schematic cross-sectional diagram illustrating an engineered substrate structure according to some embodiments of the present invention.

FIG. 1 is a simplified schematic diagram illustrating an engineered substrate structure according to some embodiments of the present invention. As illustrated in FIG. 1, the engineered substrate structure may be suitable for a variety of electronic and optical applications. The engineered substrate structure includes a core 110 (e.g., AlN Substrate) that can have a coefficient of thermal expansion (CTE) that is substantially matched to the CTE of the epitaxial material that will be grown on the engineered substrate structure, for example, on the exfoliated silicon (111) layer 125.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 110 can be on the order of 100 to 1,500 μm, for example, 750 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer 112 varies, for example, from 100 Å to 2,000 Å. Although TEOS oxides are utilized for adhesion layers 112 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 112 completely surrounds the core 110 in some embodiments to form a fully encapsulated core 110 and can be formed using an LPCVD process or other suitable deposition processes, which can be compatible with semiconductor processing and in particular with polycrystalline or composite substrates and layers. The adhesion layer 112 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 110 can be utilized, the core 110 can be flipped over, and the deposition process could be repeated to coat additional portions of the core 110. Thus, although LPCVD techniques are utilized in some embodiments to provide a fully encapsulated structure, other film formation techniques can be utilized depending on the particular application.

Figure 9:
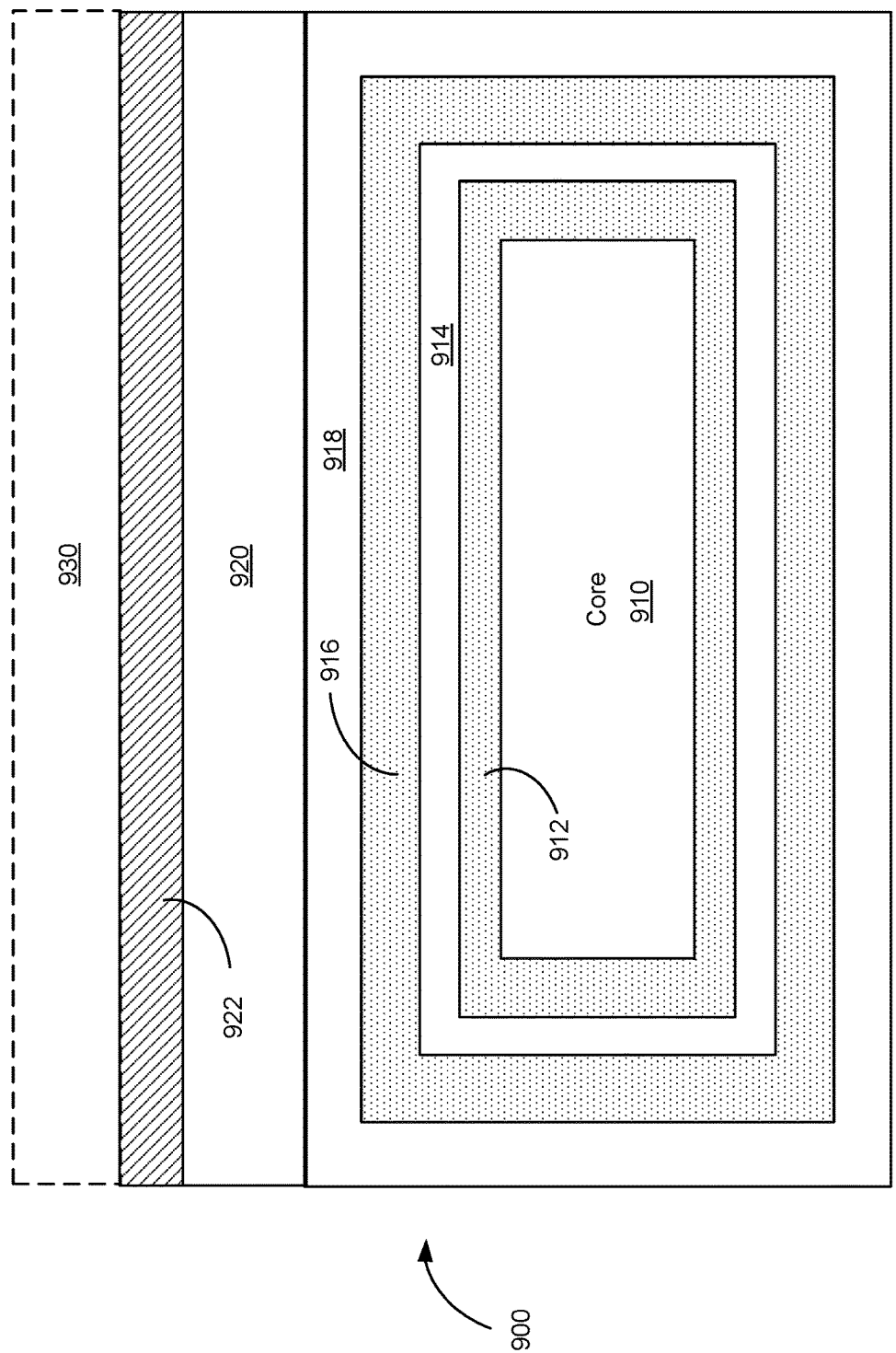
FIG. 9 is a simplified schematic diagram illustrating an engineered substrate structure according to some embodiments of the present invention.

FIG. 9 is another simplified schematic diagram illustrating an engineered substrate structure according to some embodiments of the present invention. Referring to FIGS. 1 and 9, a conductive layer 114 is formed surrounding the adhesion layer 112. In an embodiment, the conductive layer 114 is a shell of polysilicon (i.e., polycrystalline silicon) that is formed surrounding the adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the adhesion layer 112 (e.g., a TEOS oxide layer), thereby forming a fully encapsulated adhesion layer 112, and can be formed using an LPCVD process. In other embodiments, as discussed below, the conductive material can be formed on a portion of the adhesion layer 112, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a p-type polysilicon layer. In some embodiments, the doping with boron is at a level of $1 \times 10^{19}$ $cm^{-3}$ to $1 \times 10^{20}$ $cm^{-3}$ to provide for high conductivity. Other dopants at different dopant concentrations (e.g., phosphorus, arsenic, bismuth, or the like at dopant concentrations ranging from $1 \times 10^{16}$ $cm^{-3}$ to $5 \times 10^{18}$ $cm^{-3}$) can be utilized to provide either n-type or p-type semiconductor materials suitable for use in the conductive layer 114. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 114 enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed surrounding the conductive layer 114. The second adhesion layer 116 completely surrounds the conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 2,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers 118. In some implementations, the barrier layer 118 consists of a number of sub-layers that are built up to form the barrier layer 118. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate structure to prevent this undesirable diffusion.

Referring once again to FIG. 1, a bonding layer 120 (e.g., a silicon oxide layer) is deposited on a portion of the barrier layer 118, for example, the top surface of the barrier layer 118, and subsequently used during the bonding of a substantially single crystal layer 125 (e.g., a single crystal silicon layer such as the exfoliated silicon (111) layer illustrated in FIG. 1). The bonding layer 120 can be approximately 1.5 µm in thickness in some embodiments. In some embodiments, the thickness of the bonding layer 120 is 20 nm or more for bond-induced void mitigation. In some embodiments, the thickness of the bonding layer 120 is in the range of 0.75-1.5 µm.

The substantially single crystal layer 125 (e.g., exfoliated Si (111)) is suitable for use as a growth layer during an epitaxial growth process for the formation of epitaxial materials. In some embodiments, the epitaxial material can include a GaN layer 2 µm to 10 µm in thickness, which can be utilized as one of a plurality of layers utilized in optoelectronic, RF, and power devices. In an embodiment, the substantially single crystal layer 125 includes a single crystal silicon layer that is attached to the bonding layer 120 using a layer transfer process.

Referring to FIG. 9, in some embodiments, a substantially single crystal silicon layer 122 can be bonded to bonding layer 120. The substantially single crystalline layer 122 is suitable for use as a growth layer during an epitaxial growth process for the formation of epitaxial material 130. In some embodiments, the epitaxial material 130 includes a GaN layer 2 µm to 10 µm in thickness, which can be utilized as one of a plurality of layers utilized in optoelectronic devices, RF devices, power devices, and the like. In other embodiments, the epitaxial material 130 is greater than 10 µm in thickness and can be an epitaxial structure including a plurality of epitaxial layers. In an embodiment, the substantially single crystalline layer 122 includes a substantially single crystalline silicon layer that is attached to the bonding layer 120 using a layer transfer process.

Additional description related to the engineered substrate structure is provided in U.S. patent application Ser. No. 15/621,335, filed on Jun. 13, 2017, and U.S. patent application Ser. No. 15/621,235, filed on Jun. 13, 2017, the disclosures of which are hereby incorporated by reference in their entirety for all purposes.

Figure 2:
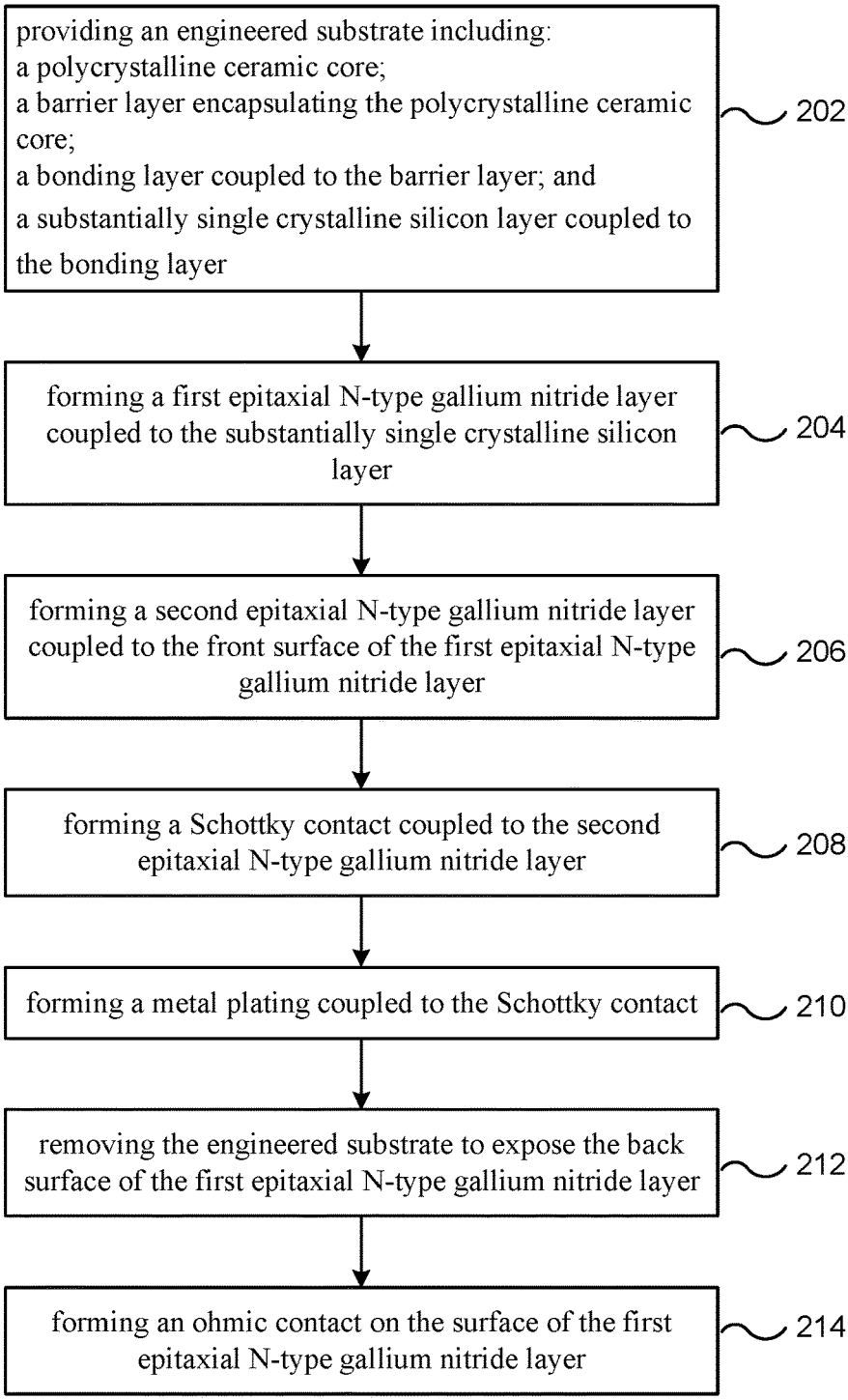
FIG. 2 shows a simplified flowchart illustrating a method of forming a Schottky barrier diode (SBD) according to some embodiments of the present invention.

FIG. 2 shows a simplified flowchart illustrating a method 200 of forming a Schottky barrier diode (SBD) according to some embodiments of the present invention. FIGS. 3A-3H show schematic cross-sectional diagrams illustrating the intermediate steps of the method 200 according to some embodiments of the present invention.

Figure 3:
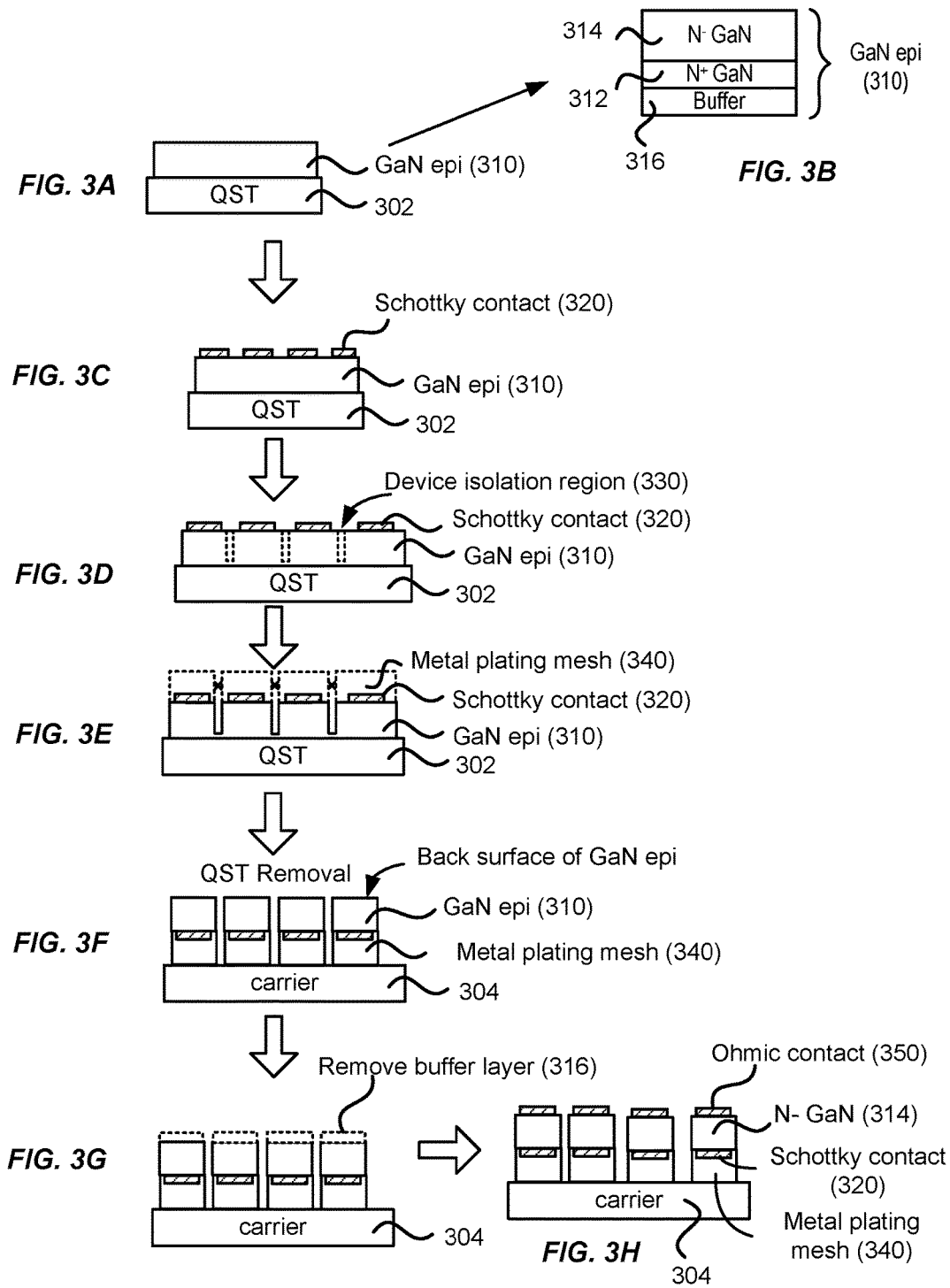
FIGS. 3A-3H show schematic cross-sectional diagrams illustrating the intermediate steps of the method shown in FIG. 2 according to some embodiments of the present invention.

Referring to FIGS. 2 and 3A, the method 200 includes, at 202, providing an engineered substrate (QST) 302. According to some embodiments, the engineered substrate 302 may include a polycrystalline ceramic core, a barrier layer encapsulating the polycrystalline ceramic core, a bonding layer coupled to the barrier layer, and a substantially single crystalline silicon layer coupled to the bonding layer.

In some embodiments, the polycrystalline ceramic core of the engineered substrate may include polycrystalline aluminum gallium nitride (AlGaN), polycrystalline gallium nitride (GaN), polycrystalline aluminum nitride (AlN), polycrystalline silicon carbide (SiC), or a combination thereof. In some embodiments, the barrier layer may include $Si_xO_y$, $Si_xN_y$, $Si_xO_yN_z$, SiCN, SiON, AlN, SiC, or a combination thereof. In some embodiments, the bonding layer may include an oxide layer, such as a silicon oxide layer. In one embodiment, the single crystal silicon layer includes a silicon (111) layer that may be suitable for use as a growth layer during epitaxial growth process for the formation of epitaxial materials as discussed below.

In some embodiments, as discussed above with reference to FIG. 1, the engineered substrate 302 may further include a first adhesion layer coupled to the polycrystalline ceramic core, a conductive layer coupled to the first adhesion layer, and a second adhesion layer coupled to the conductive layer, where the first adhesion layer, the conductive layer and the second adhesion layer are disposed between the polycrystalline ceramic core and the barrier layer. In some embodiments, the first adhesion layer may comprise a first tetraethyl orthosilicate (TEOS) oxide layer, and the second adhesion layer may comprise a second TEOS oxide layer. The conductive layer may comprise a polysilicon layer. In some embodiments, the engineered substrate 302 may further include a nucleation layer coupled to the substantially single crystalline silicon layer for facilitating the formation of the epitaxial device layers.

Referring to FIGS. 2, and 3A-3B, the method 200 further includes, at 204, forming a first epitaxial N-type gallium nitride (GaN) layer 312 (may be referred to as an "N+ GaN" layer) coupled to the substantially single crystalline silicon layer. The first epitaxial N-type GaN layer 312 has a back surface and a front surface. The back surface is coupled to the engineered substrate 302. The method 200 further includes, at 206, forming a second epitaxial N-type GaN layer 314 (may be referred to as an "N− GaN" layer) coupled to the front surface of the first epitaxial N-type GaN layer 312.

The first N-type GaN layer 312 may facilitate the formation of an ohmic contact and may have a relatively high N-type doping concentration, for example in the order of about $1 \times 10^{18}$ cm$^{-3}$. The second N-type GaN layer 314 may serve as a drift region and may have a relatively low doping concentration, for example in the order of about $1 \times 10^{16}$ cm$^{-3}$. In some embodiments, the second N-type GaN layer 314 may have a thickness that is greater than about 20 μm. By using a CTE-matched engineered substrate 302, epitaxial growth of a relatively thick drift region with low dislocation density may be possible. A thicker drift region may afford the Schottky diode lower leakage current and a much higher breakdown voltage, as well as many other advantages.

According to some embodiments, the method 200 may further include, before forming the first epitaxial N-type GaN layer 312 and the second epitaxial N-type GaN layer 314, forming a buffer layer 316 coupled to the substantially single crystal layer. The first epitaxial N-type GaN layer 312 and the second epitaxial N-type GaN layer 314 are then subsequently formed on the buffer layer 316. In some embodiments, the buffer layer 316 may include a superlattice that includes a plurality of layers. For example, the buffer layer 316 may include an aluminum nitride layer coupled to the single crystal silicon layer, an aluminum gallium nitride layer coupled to the aluminum nitride layer, and a gallium nitride layer coupled to the aluminum gallium nitride layer. In another embodiment, the buffer layer 316 may include a single layer of aluminum gallium nitride. The entire epitaxial layer 310 including the buffer layer 316, the first epitaxial N-type GaN layer 312, and the second epitaxial N-type GaN layer 314 may be referred to as the GaN epitaxial layer 310, as illustrated in FIG. 3B.

According to some embodiments, the first epitaxial N-type GaN layer 312, the second epitaxial N-type GaN layer 314, and the buffer layer 316 may be formed by thin film deposition techniques such as chemical vapor deposition CVD (including metal-organic CVD (MOCVD), low-pressure CVD (LPCVD), plasma-enhanced CVD (PECVD), atomic-layer CVD (ALCVD)), hydride vapor phase epitaxy (HVPE), atomic layer deposition (ALD), molecular beam epitaxy (MBE), or a combination thereof.

Referring to FIGS. 2 and 3C, the method 200 further includes, at 208, forming one or more Schottky contacts 320 coupled to the second epitaxial N-type GaN layer 314. The Schottky contacts 320 may be formed by a suitable metallization process. In some embodiments, the Schottky contacts 320 may comprise a nickel-platinum (Ni/Pt) alloy, a nickel-gold (Ni/Au) alloy, or the like. Referring to FIG. 3D, after the Schottky contacts 320 are formed, the method 200 may further include forming a plurality of device isolation regions 330. The device isolation regions 330 may be formed by etching away portions of the GaN epitaxial layer 310 in the regions between adjacent devices.

Referring to FIGS. 2 and 3E, the method 200 further includes, at 210, forming a metal plating mesh 340 over the one or more Schottky contacts. In some embodiments, the metal plating mesh 340 may comprise copper (Cu) or other suitable metal. In some embodiments, the metal plating mesh 340 may have a thickness ranging from about 50 μm to about 100 μm.

Referring to FIGS. 2 and 3F, the method 200 further includes, at 212, removing the engineered substrate 302 to expose the back surface of the first epitaxial N-type GaN layer 312. The engineered substrate 302 may be removed, for example, by mechanical polishing, dry etch, wet etch, or a liftoff process using an etching chemical such as hydrofluoric acid (HF) or sulfuric acid ($H_2SO_4$). Because the epitaxial gallium nitride layer 310 is formed on substantially CTE-matched engineered substrate 302, the GaN epitaxial layer 310 may not curl under stress after the engineered substrate 302 is removed.

After the engineered substrate 302 is removed, the device structure may be flipped, and an optional carrier substrate 304 may be temporarily bonded to the metal plating mesh 340 using an epoxy, as illustrated in FIG. 3F. Referring to FIGS. 2 and 3G, the method 200 may include removing the buffer layer 316 to access the first epitaxial N-type GaN layer 312. Referring to FIGS. 2 and 3H, the method 200 further includes, at 214, forming one or more ohmic contacts 350 on the back surface of the first epitaxial N-type GaN layer 312.

Figure 4:
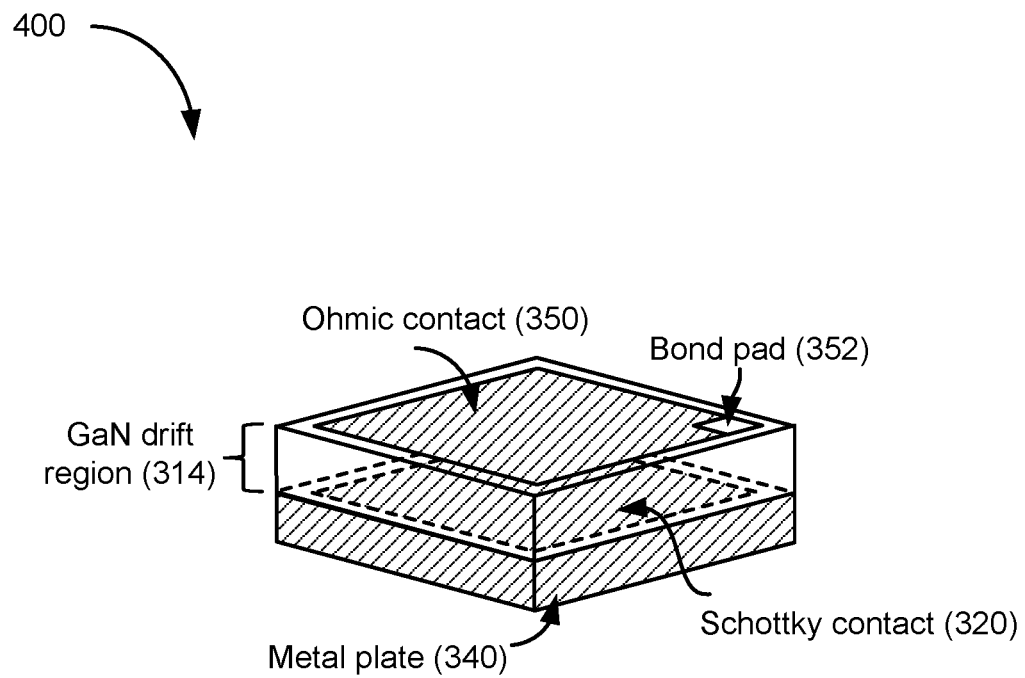
FIG. 4 illustrates schematically a perspective view of a Schottky diode according to some embodiments of the present invention.

According to an embodiment, the carrier substrate 304 may be removed and the device structure may be diced to produce one or more chip-scale package (CSP) Schottky diodes. FIG. 4 illustrates schematically a perspective view of a Schottky diode 400 that may be made using the method 200 described above, according to an embodiment of the present invention. The Schottky diode 400 may include a bond pad 352 electrically coupled to the ohmic contact 350 as a cathode electrode. In some embodiments, the Schottky diode 400 may have a GaN drift region 314 (i.e., the second N-type GaN layer) with a thickness that is greater than about 20 μm. The ability to deposit a relatively thick drift region 314 with low dislocation density may afford the Schottky diode 400 low leakage current and a much higher breakdown voltage, as well as many other advantages.

It should be appreciated that the specific steps illustrated in FIG. 2 provide a particular method of 200 according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

According to some embodiments, vertical P-N diodes may be fabricated using a method similar to the method 200. For example, after the first and the second epitaxial N-type gallium nitride layers 312 and 314 are formed, an epitaxial P-type gallium nitride layer may be formed on the second epitaxial N-type gallium nitride layer, and an ohmic contact may be formed on the epitaxial P-type gallium nitride layer.

Figure 5:
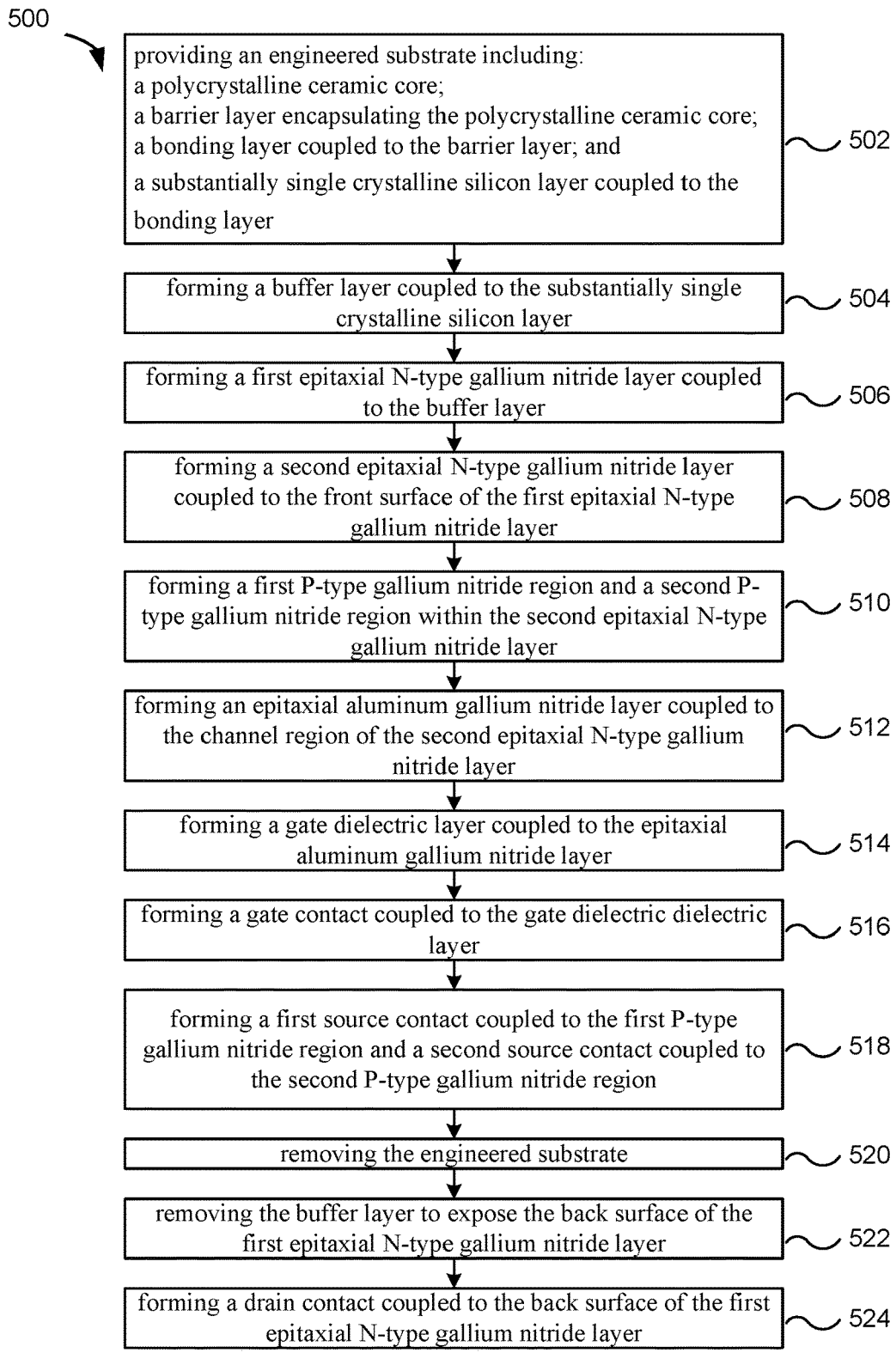
FIG. 5 shows a simplified flowchart illustrating a method of forming a vertical power transistor according to some embodiments of the present invention.
Figure 6A:
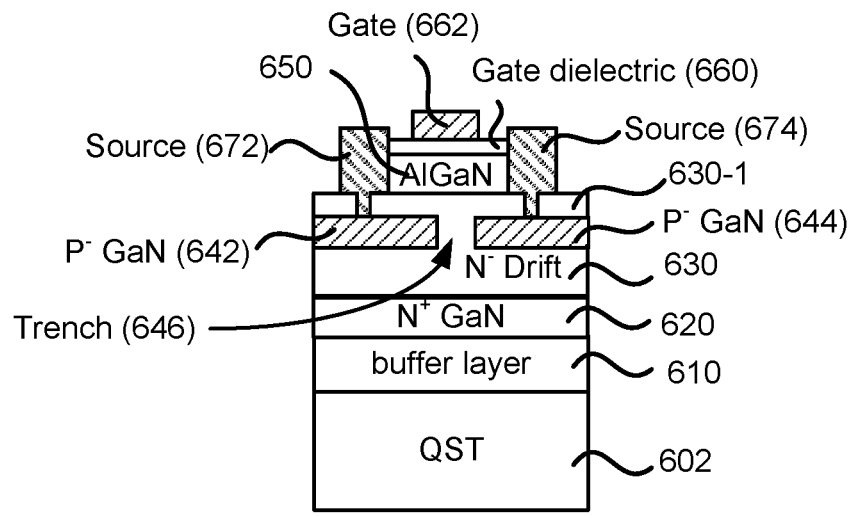
FIGS. 6A-6C show schematic cross-sectional diagrams illustrating the intermediate steps of the method shown in FIG. 5 according to some embodiments of the present invention.
Figure 6B:
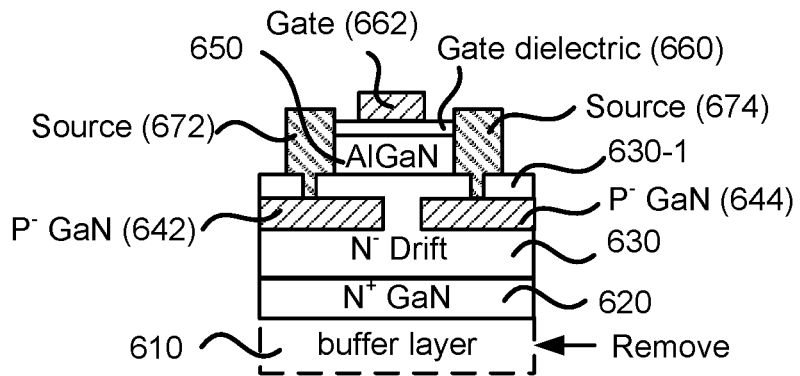
Figure 6C:
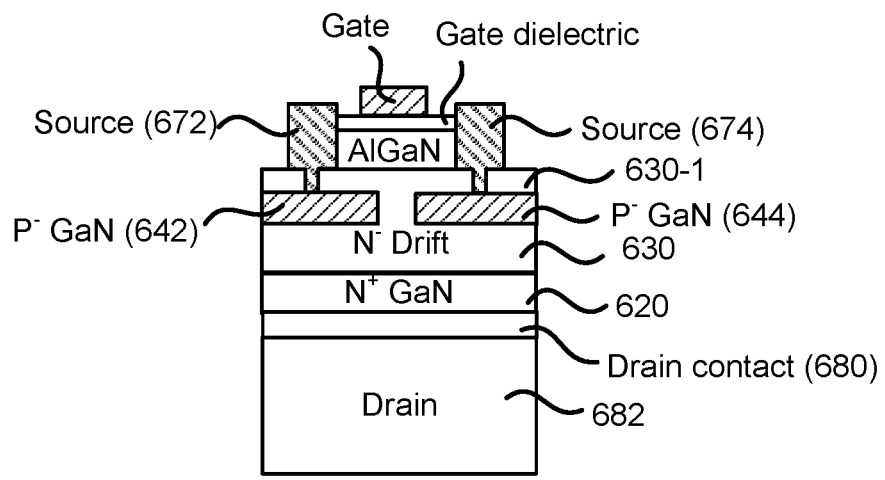

FIG. 5 shows a simplified flowchart illustrating a method 500 of forming a vertical power transistor according to some embodiments of the present invention. FIGS. 6A-6C show schematic cross-sectional diagrams illustrating the intermediate steps of the method 500 according to some embodiments of the present invention.

Referring to FIGS. 5 and 6A, the method 500 includes, at 502, providing an engineered substrate (QST) 602. According to some embodiments, the engineered substrate 602 may include a polycrystalline ceramic core, a barrier layer encapsulating the polycrystalline ceramic core, a bonding layer coupled to the barrier layer, and a substantially single crystalline silicon layer coupled to the bonding layer, substantially as described above.

Still referring to FIGS. 5 and 6A, the method 500 further includes, at 504, forming a buffer layer 610 coupled to the substantially single crystalline silicon layer. In some embodiments, the buffer layer 610 may include a superlattice that includes a plurality layers. For example, the buffer layer 610 may include an aluminum nitride layer coupled to the single crystal silicon layer, an aluminum gallium nitride layer coupled to the aluminum nitride layer, and a gallium nitride layer coupled to the aluminum gallium nitride layer. In another embodiment, the buffer layer 610 may comprise a single layer of aluminum gallium nitride.

Still referring to FIGS. 5 and 6A, the method 500 further includes, at 506, forming a first epitaxial N-type gallium nitride layer 620 (referred to as "N+ GaN") coupled to the buffer layer 610. The first epitaxial N-type gallium nitride layer 620 has a back surface coupled to the buffer layer 610 and a front surface. In some embodiments, the first N-type gallium nitride layer 620 may have a relatively high doping concentration, for example in the order of about $1 \times 10^{18}$ $cm^{-3}$. The first N-type gallium nitride layer 620 may facilitate the formation of an ohmic contact for the drain electrode, as described below. The method 500 further includes, at 508, forming a second epitaxial N-type gallium nitride layer 630 (referred to as "N⁻ Drift" layer) coupled to the front surface of the first epitaxial N-type gallium nitride layer 620. The second epitaxial N-type gallium nitride layer 630 may serve as the drift region for the power transistor. In some embodiments, the second epitaxial N-type gallium nitride layer 630 may have a relatively low doping concentration, for example in the order of about $1 \times 10^{16}$ $cm^{-3}$. In some embodiments, the second epitaxial N-type gallium nitride layer 630 has a thickness that is greater than about 20 µm.

Still referring to FIGS. 5 and 6A, the method 500 further includes, at 510, forming a first P-type gallium nitride region 642 and a second P-type gallium nitride region 644 (referred to as "P⁻ GaN") within the second epitaxial N-type gallium nitride layer 630. The first P-type gallium nitride region 642 and the second P-type gallium nitride region 644 may serve as a current blocking layer in the power transistor. The first P-type gallium nitride region 642 and the second P-type gallium nitride region 644 are separated by a trench 646.

According to an embodiment, the first P-type gallium nitride region 642 and a second P-type gallium nitride region 644 may be formed by implanting a first region and a second region of the second epitaxial N-type gallium nitride layer 630 with a P-type dopant such as Mg or other alkaline earth metals (e.g., Be, Sr, Ba, and Ra).

According to another embodiment, the first P-type gallium nitride region 642 and the second P-type gallium nitride region 644 may be formed by forming an epitaxial P-type gallium nitride layer on the second epitaxial N-type gallium nitride layer 630, and then removing a portion of the epitaxial P-type gallium nitride layer to form a narrow trench 646. In some embodiments, the trench 646 may be formed by etching using a Cl-based chemistry in an inductively coupled plasma (ICP) process or other suitable etching processes. Then a regrowth epitaxial N-type gallium nitride layer 630-1 is formed in and over the trench 646 and over the remaining portion of the epitaxial P-type gallium nitride layer. The regrowth epitaxial N-type gallium nitride layer 630-1 forms a channel of the power transistor.

Still referring to FIGS. 5 and 6A, the method 500 further includes, at 512, forming an epitaxial aluminum gallium nitride layer (AlGaN) 650 coupled to the channel region. The interface between the epitaxial aluminum gallium nitride layer (AlGaN) 650 and the regrowth epitaxial N-type gallium nitride layer 630-1 (referred to as the AlGaN/GaN interface) may result in a two-dimensional electron gas (2DEG) due to polarization induced charge at the heterointerface. The method 500 further includes, at 514, forming a gate dielectric layer 660 coupled to the epitaxial aluminum gallium nitride layer 650, and at 516, forming a gate contact 662 coupled to the gate dielectric layer 660. The method 500 may further include forming a gate electrode (not shown in FIG. 6A) coupled to the gate contact 662. The gate electrode may comprise Cu, Au, Ti, or other suitable metals.

Still referring to FIGS. 5 and 6A, the method 500 further includes, at 518, forming a first source contact 672 coupled to the first P-type gallium nitride region 642 and a second source contact 674 coupled to the second P-type gallium nitride region 644. In some embodiments, the buried first and second P-type gallium nitride regions 642 and 644 may be accessed by forming vias. In some embodiments, each of the first source contact 672 and the second source contact 674 may include an appropriate metal, such as Au, Pd, Pt, Sc, or a combination thereof, for making good ohmic contacts with the buried body P-type GaN layer. The method 500 may further include forming source electrodes (not shown in FIG. 6A) coupled to the first source contact 642 and the second source contact 644. In some embodiments, the source electrodes may comprise Cu, Au, Ti, or other suitable metals.

Referring to FIGS. 5 and 6B-5C, the method 500 further includes, at 520, removing the engineered substrate 602. The engineered substrate 602 may be removed, for example, by mechanical polishing, dry etch, wet etch, or a liftoff process using an etching chemical such as hydrofluoric acid (HF) or sulfuric acid ($H_2SO_4$). The method 500 further includes, and at 522, removing the buffer layer 610 to access the back surface of the first epitaxial N-type gallium nitride layer 620, and, at 524, forming a drain contact 680 coupled to the back surface of the first epitaxial N-type gallium nitride layer 620. The method 500 may further include forming an electrode 682 coupled to the drain contact 680 as illustrated in FIG. 6C. The device structure can then be diced to produce one or more chip-scale package (CSP) power transistors.

It should be appreciated that the specific steps illustrated in FIG. 5 provide a particular method of 500 according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
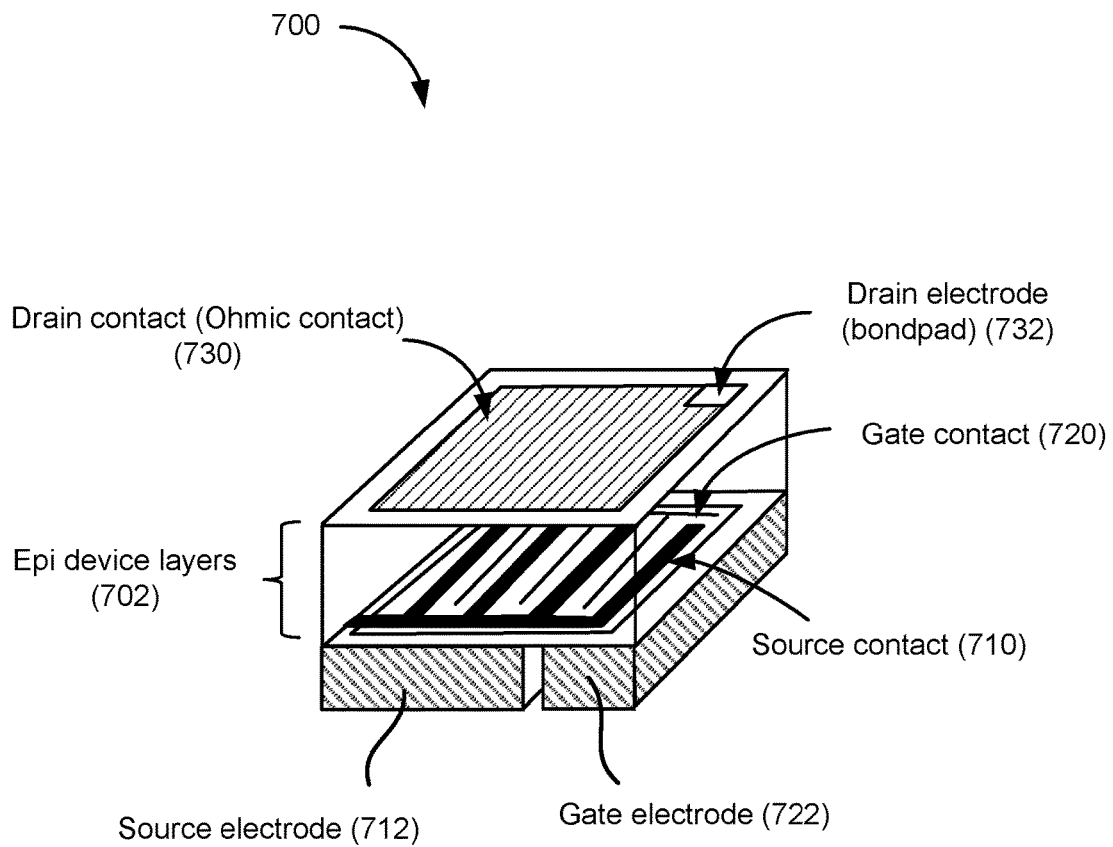
FIG. 7 illustrates schematically a perspective view of a power transistor according to some embodiments of the present invention.

FIG. 7A illustrates schematically a perspective view of a power transistor 700 according to some embodiments of the present invention. The power transistor 700 may include a plurality of epitaxial device layers 702 that can include, for example, the first epitaxial N-type gallium nitride layer 620 (referred to as "N+ GaN"), the second epitaxial N-type gallium nitride layer 630 (referred to as "N− Drift" layer), and the epitaxial aluminum gallium nitride layer (AlGaN) 650, as illustrated in FIGS. 6A-6C. The power transistor 700 further includes a source contact 710 and a gate contact 720. As illustrated, the source contact 710 and the gate contact 720 are laid out in an interdigitated fashion. The power transistor 700 may further include a source electrode 712 electrically coupled to the source contact 710, and a gate electrode 722 electrically coupled to the gate contact 720. The power transistor 700 may further include a drain contact (ohmic contact) 730 coupled to a back surface of the plurality of epitaxial device layers 702, and a drain electrode (bond pad) 732 electrically coupled to the drain contact 730.

Figure 8:
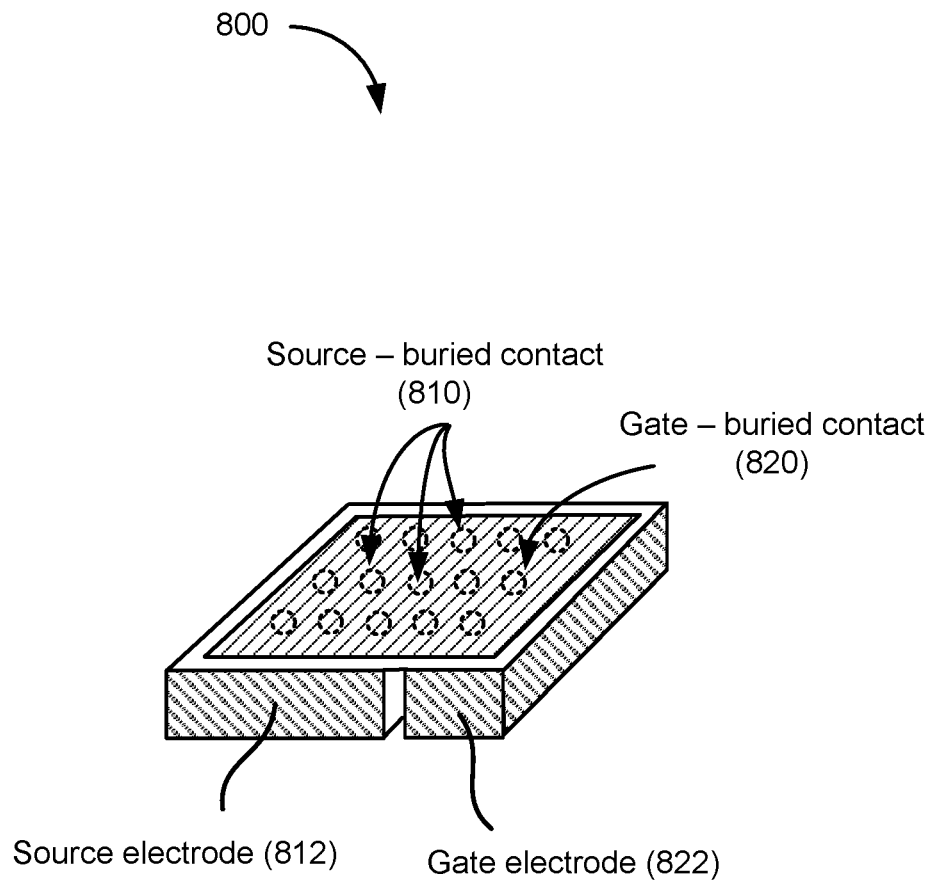
FIG. 8 illustrates schematically a perspective view of a power transistor according to some other embodiments of the present invention.

FIG. 8 shows a schematic perspective view of a power transistor 800 with a different layout of the source contact and the gate contact according some other embodiments of the present invention. As illustrated, the power transistor 800 may include a buried source contact 810 and a buried gate contact 820, electrically coupled to a source electrode 812 and a gate electrode 822, respectively.

As described above, embodiments of the present invention provide methods of forming a vertical power transistor that may have a relatively thick N− GaN drift region. A thick drift region may result in higher breakdown voltages, for example higher than about 1200 V. By using a CTE-matched engineered substrate, the epitaxial GaN layers may have reduced number of defects, which may afford the power transistors improved reliability. In vertical power transistors, breakdown occurs in bulk and not surface, which may provide avalanche capability. In addition, current flows vertical and not parallel to surface. Relatively high current (e.g., greater than 20 A) may be realized.

FIG. 9 is a simplified schematic cross-sectional diagram illustrating an engineered substrate 900 according to an embodiment of the present invention. The engineered substrate 900 illustrated in FIG. 9 is suitable for a variety of electronic and optical applications. The engineered substrate 900 includes a core 910 that can have a coefficient of thermal expansion (CTE) that is substantially matched to the CTE of the epitaxial material that will be grown on the engineered substrate 900. Epitaxial material 930 is illustrated as optional because it is not required as an element of the engineered substrate 900, but will typically be grown on the engineered substrate 900.

For applications including the growth of gallium nitride (GaN)-based materials (epitaxial layers including GaN-based layers), the core 910 can be a polycrystalline ceramic material such as polycrystalline aluminum nitride (AlN), which can include a binding material such as yttrium oxide. Other materials can be utilized in the core 910, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 910 can be on the order of 100 μm to 1,500 μm, for example, 725 μm. The core 910 is encapsulated in an adhesion layer 912 that can be referred to as a shell or an encapsulating shell. In an embodiment, the adhesion layer 912 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. In some embodiments, the adhesion layer 912 completely surrounds the core 910 to form a fully encapsulated core. The adhesion layer 912 can be formed using a low pressure chemical-vapor deposition (LPCVD) process. The adhesion layer 912 provides a surface on which subsequent layers adhere to form elements of the engineered substrate 900 structure.

In addition to the use of LPCVD processes, furnace-based processes, and the like to form the encapsulating first adhesion layer 912, other semiconductor processes can be utilized according to embodiments of the present invention, including CVD processes or similar deposition processes. As an example, a deposition process that coats a portion of the core can be utilized, the core 910 can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 914 is formed surrounding the adhesion layer 912. In an embodiment, the conductive layer 914 is a shell of polysilicon (i.e., polycrystalline silicon) that is formed surrounding the first adhesion layer 912 since polysilicon can exhibit poor adhesion to ceramic materials. In embodiments in which the conductive layer 914 is polysilicon, the thickness of the polysilicon layer can be on the order of 500-5,000 Å, for example, 2,500 Å. In some embodiments, the polysilicon layer can be formed as a shell to completely surround the first adhesion layer 912 (e.g., a TEOS oxide layer), thereby forming a fully encapsulated first adhesion layer 912, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer 914 can be a polysilicon layer doped to provide a highly conductive material, for example, doped with boron to provide a P-type polysilicon layer. In some embodiments, the doping with boron is at a level of $1\times10^{19}$ cm$^{-3}$ to $1\times10^{20}$ cm$^{-3}$ to provide for high conductivity. Other dopants at different dopant concentrations (e.g., phosphorus, arsenic, bismuth, or the like at dopant concentrations ranging from $1\times10^{16}$ cm$^{-3}$ to $5\times10^{18}$ cm$^{-3}$) can be utilized to provide either N-type or P-type semiconductor materials suitable for use in the conductive layer 914. One of ordinary skill in the art would recognize many variations, modifications, and alternatives.

The presence of the conductive layer 914 is useful during electrostatic chucking of the engineered substrate 900 to semiconductor processing tools, for example tools with electrostatic discharge chucks (ESC). The conductive layer 914 enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 916 (e.g., a TEOS oxide layer on the order of 1,000 Å in thickness) is formed surrounding the conductive layer 914. In some embodiments, the second adhesion layer 916 completely surrounds the conductive layer 914 to form a fully encapsulated structure. The second adhesion layer 916 can be formed using an LPCVD process, a CVD process, or any other suitable deposition process, including the deposition of a spin-on dielectric.

A barrier layer 918, for example, a silicon nitride layer, is formed surrounding the second adhesion layer 916. In an embodiment, the barrier layer 918 is a silicon nitride layer that is on the order of 4,000 Å to 5,000 Å in thickness. The barrier layer 918 completely surrounds the second adhesion layer 916 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 918, e.g., a silicon nitride layer, prevents diffusion and/or outgassing of elements present in the core 910 into the environment of the semiconductor processing chambers in which the engineered substrate 900 could be present, for example, during a high temperature (e.g., 1,000° C.) epitaxial growth process. Elements present in the core 910 can include, for example, yttrium oxide (i.e., yttria), oxygen, metallic impurities, other trace elements, and the like. The elements diffused from the core 910 can cause unintentional doping in engineered layers 920/922. The elements outgassed from the core 910 can travel through the chamber and adsorb elsewhere on the wafer causing impurities in engineered layers 920/922 and epitaxial material 930. Utilizing the encapsulating layers described herein, ceramic materials, including polycrystalline AlN that are designed for non-clean room environments, can be utilized in semiconductor process flows and clean room environments.

A bonding layer 920 (e.g., a silicon oxide layer) is deposited on a portion of the barrier layer 918, for example, the top surface of the barrier layer, and subsequently used during the bonding of a single crystal layer 922. The bonding layer 920 can be approximately 1.5 μm in thickness in some embodiments. The single crystal layer 922 can include, for example, Si, SiC, sapphire, GaN, AlN, SiGe, Ge, Diamond, Ga$_2$O$_3$, AlGaN, InGaN, InN, and/or ZnO. In some embodiments, the single crystal layer 922 can have a thickness from 0-0.5 μm. The single crystal layer 922 is suitable for use as a growth layer during an epitaxial growth process for the formation of epitaxial material 930. The crystalline layers of the epitaxial material 930 are an extension of the underlying semiconductor lattice associated with the single crystal layer 922. The unique CTE matching properties of the engineered substrate 900 enable growth of thicker epitaxial material 930 than existing technologies. In some embodiments, the epitaxial material 930 includes a gallium nitride layer, 2 μm to 10 μm in thickness, which can be utilized as one of a plurality of layers utilized in optoelectronic devices, power devices, and the like. In an embodiment, the bonding layer 920 includes a single crystal silicon layer that is attached to a silicon oxide barrier layer 918 using a layer transfer process.

Figure 10:
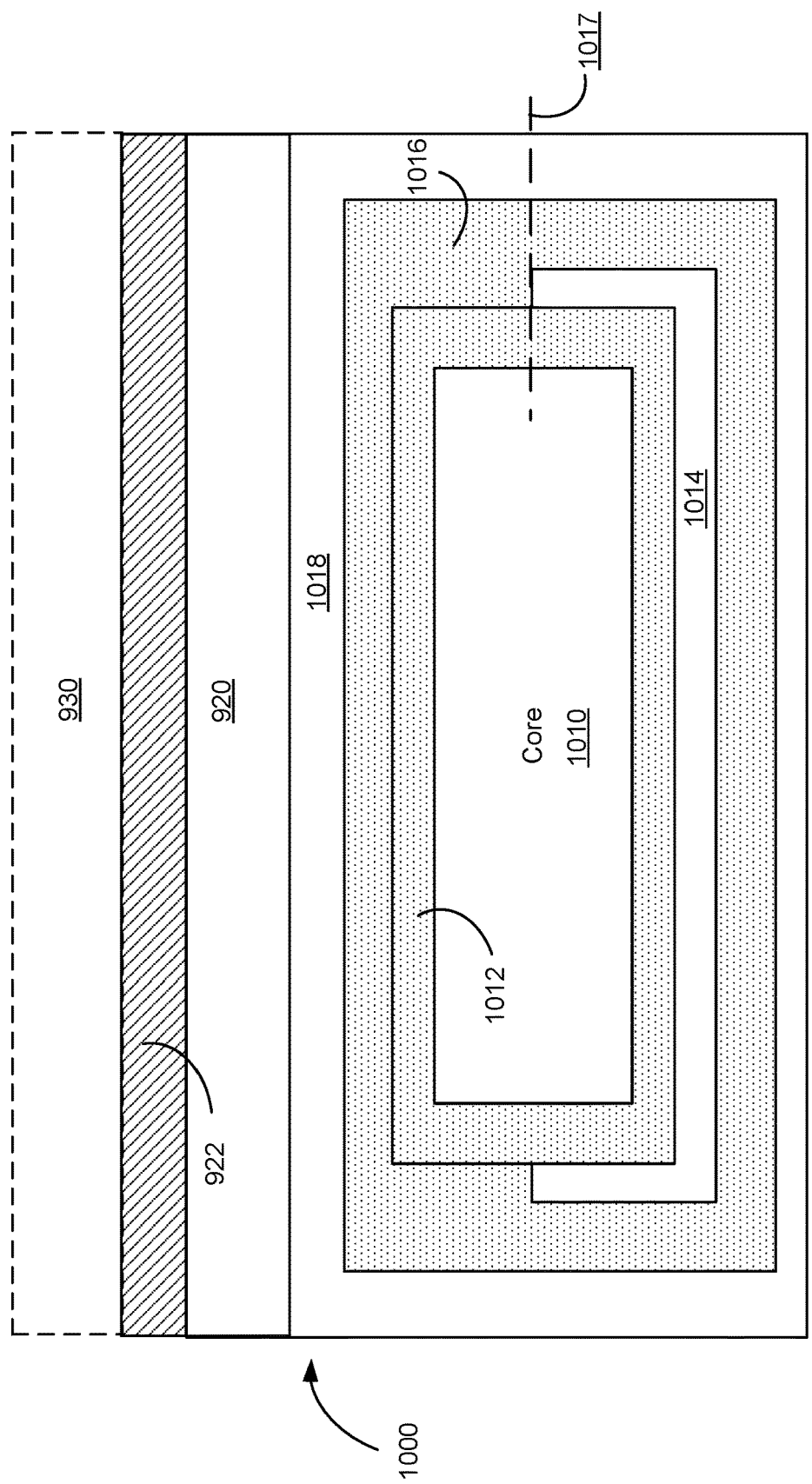
FIG. 10 is a simplified schematic diagram illustrating an engineered substrate structure according to some other embodiments of the present invention.

FIG. 10 is a simplified schematic diagram illustrating an engineered substrate structure according to an embodiment of the present invention. The engineered substrate 1000 illustrated in FIG. 10 is suitable for a variety of electronic and optical applications. The engineered substrate includes a core 1010 that can have a coefficient of thermal expansion (CTE) that is substantially matched to the CTE of the epitaxial material 930 that will be grown on the engineered substrate 1000. The epitaxial material 930 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 1010 can be a polycrystalline ceramic material, for example, polycrystalline aluminum nitride (AlN). The thickness of the core 1010 can be on the order of 100 to 1,500 μm, for example, 725 μm. The core 1010 is encapsulated in a first adhesion layer 1012 that can be referred to as a shell or an encapsulating shell. In this implementation, the first adhesion layer 1012 completely encapsulates the core, but this is not required by the present invention, as discussed in additional detail with respect to FIG. 11.

In an embodiment, the first adhesion layer 1012 comprises a tetraethyl orthosilicate (TEOS) layer on the order of 1,000 Å in thickness. In other embodiments, the thickness of the first adhesion layer 1012 varies, for example, from 100 Å to 2,000 Å. Although TEOS is utilized for adhesion layers in some embodiments, other materials that provide for adhesion between later deposited layers and underlying layers or materials can be utilized according to an embodiment of the present invention. For example, SiO$_2$, SiON, and the like adhere well to ceramic materials and provide a suitable surface for subsequent deposition, for example, of conductive materials. The first adhesion layer 1012 completely surrounds the core 1010 in some embodiments to form a fully encapsulated core and can be formed using an LPCVD process. The adhesion layer 1012 provides a surface on which subsequent layers adhere to form elements of the engineered substrate structure.

In addition to the use of LPCVD processes, furnace-based processes, and the like to form the encapsulating adhesion layer 1012, other semiconductor processes can be utilized according to embodiments of the present invention. As an example, a deposition process, for example, CVD, PECVD, or the like, that coats a portion of the core 1010 can be utilized, the core 1010 can be flipped over, and the deposition process could be repeated to coat additional portions of the core.

A conductive layer 1014 is formed on at least a portion of the first adhesion layer 1012. In an embodiment, the conductive layer 1014 includes polysilicon (i.e., polycrystalline silicon) that is formed by a deposition process on a lower portion (e.g., the lower half or backside) of the core/adhesion layer structure. In embodiments in which the conductive layer 1014 is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 1014 can be a polysilicon layer doped to provide a highly conductive material, for example, the conductive layer 1014 can be doped with boron to provide a p-type polysilicon layer. In some embodiments, the doping with boron is at a level ranging from about $1 \times 10^{19}$ cm$^{-3}$ to $1 \times 10^{20}$ cm$^{-3}$ to provide for high conductivity. The presence of the conductive layer 1014 is useful during electrostatic chucking of the engineered substrate to semiconductor processing tools, for example tools with electrostatic chucks (ESC). The conductive layer 1014 enables rapid dechucking after processing.

Thus, embodiments of the present invention provide substrate structures that can be processed in manners utilized with conventional silicon wafers. One of ordinary skill in the art would recognize many variations, modifications, and alternatives.

A second adhesion layer 1016 (e.g., a second TEOS layer) is formed surrounding the conductive layer 1014 (e.g., a polysilicon layer). The second adhesion layer 1016 is on the order of 1,000 Å in thickness. The second adhesion layer 1016 can completely surround the conductive layer 1014 as well as the first adhesion layer 1012 in some embodiments to form a fully encapsulated structure and can be formed using an LPCVD process. In other embodiments, the second adhesion layer 1016 only partially surrounds the conductive layer 1014, for example, terminating at the position illustrated by plane 1017, which may be aligned with the top surface of the conductive layer 1014. In this example, the top surface of the conductive layer 1014 will be in contact with a portion of barrier layer 1018. One of ordinary skill in the art would recognize many variations, modifications, and alternatives.

A barrier layer 1018 (e.g., a silicon nitride layer) is formed surrounding the second adhesion layer 1016. The barrier layer 1018 is on the order of 4,000 Å to 5,000 Å in thickness in some embodiments. In some embodiments, the barrier layer 1018 completely surrounds the second adhesion layer 1016 to form a fully encapsulated structure and can be formed using an LPCVD process.

In some embodiments, the use of a silicon nitride barrier layer prevents diffusion and/or outgassing of elements present in the core 1010, for example, yttrium oxide (i.e., yttria), oxygen, metallic impurities, other trace elements and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

Figure 11:
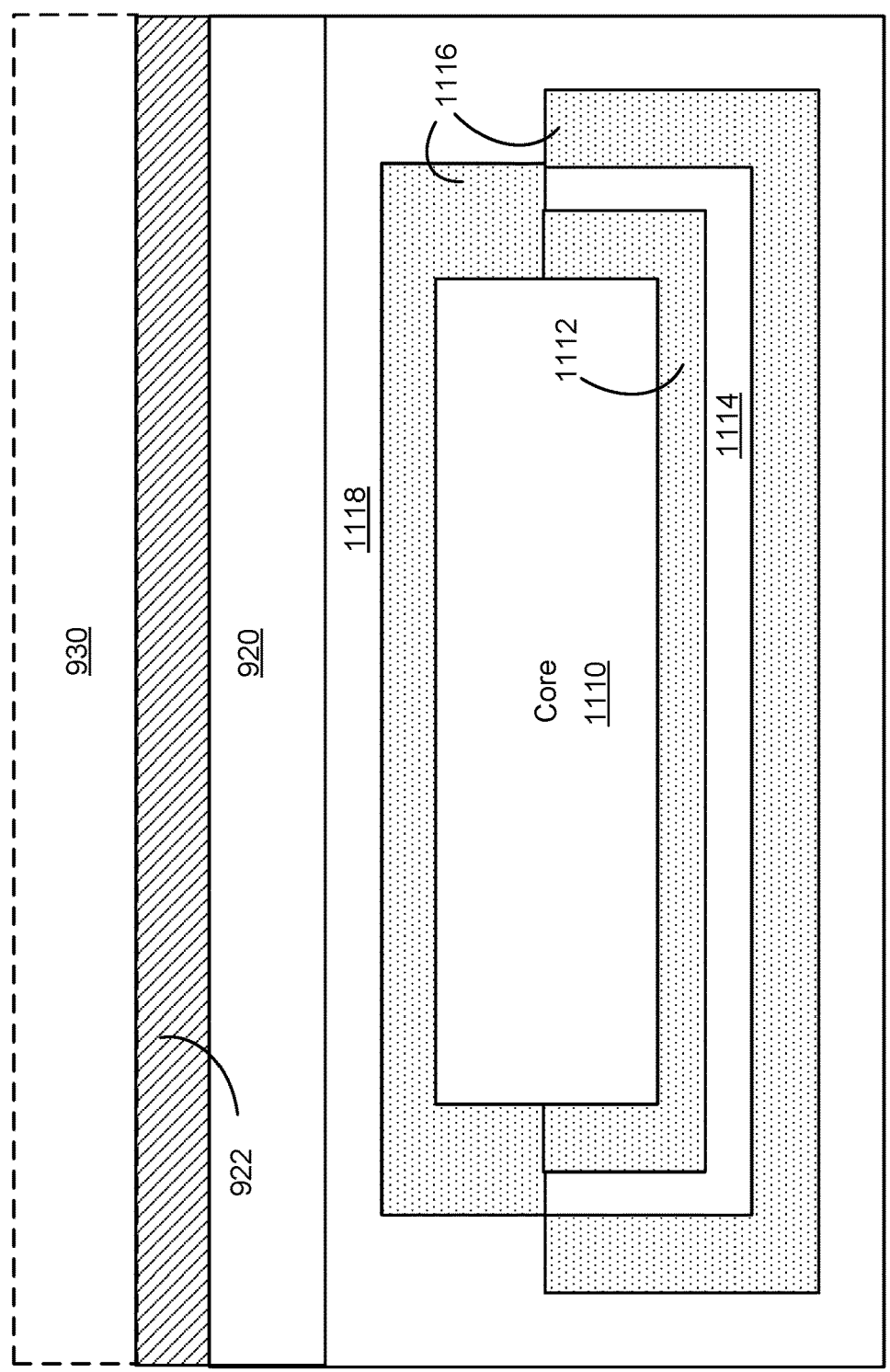
FIG. 11 is a simplified schematic diagram illustrating an engineered substrate structure according to some further embodiments of the present invention.

FIG. 11 is a simplified schematic diagram illustrating an engineered substrate structure according to another embodiment of the present invention. In the embodiment illustrated in FIG. 11, a first adhesion layer 1112 is formed on at least a portion of the core 1110, but does not encapsulate the core 1110. In this implementation, the first adhesion layer 1112 is formed on a lower surface of the core 1110 (the backside of the core 1110) in order to enhance the adhesion of a subsequently formed conductive layer 1114 as described more fully below. Although adhesion layer 1112 is only illustrated on the lower surface of the core 1110 in FIG. 11, it will be appreciated that deposition of adhesion layer material on other portions of the core 1110 will not adversely impact the performance of the engineered substrates structure and such material can be present in various embodiments. One of ordinary skill in the art would recognize many variations, modifications, and alternatives.

The conductive layer 1114 does not encapsulate the first adhesion layer 1112 and the core 1110, but is substantially aligned with the first adhesion layer 1112. Although the conductive layer 1114 is illustrated as extending along the bottom or backside and up a portion of the sides of the first adhesion layer 1112, extension along the vertical side is not required by the present invention. Thus, embodiments can utilize deposition on one side of the substrate structure, masking of one side of the substrate structure, or the like. The conductive layer 1114 can be formed on a portion of one side, for example, the bottom/backside, of the first adhesion layer 1112. The conductive 1114 layer provides for electrical conduction on one side of the engineered substrate structure, which can be advantageous in RF and high power applications. The conductive layer 1114 can include doped polysilicon as discussed in relation to the conductive layer 1014 in FIG. 10.

A portion of the core 1110, portions of the first adhesion layer 1112, and the conductive layer 1114 are covered with a second adhesion layer 1116 in order to enhance the adhesion of the barrier layer 1118 to the underlying materials. The barrier layer 1118 forms an encapsulating structure to prevent diffusion from underlying layers as discussed above.

In addition to semiconductor-based conductive layers, in other embodiments, the conductive layer 1114 is a metallic layer, for example, 500 Å of titanium, or the like.

Referring once again to FIG. 11, depending on the implementation, one or more layers may be removed. For example, layers 1112 and 1114 can be removed, only leaving a single adhesion shell 1116 and the barrier layer 1118. In another embodiment, only layer 1114 can be removed. In this embodiment, layer 1112 may also balance the stress and the wafer bow induced by layer 920, deposited on top of layer 1118. The construction of a substrate structure with insulating layers on the top side of Core 1110 (e.g., with only insulating layer between core 1110 and layer 920) will provide benefits for power/RF applications, where a highly insulating substrate is desirable.

In another embodiment, the barrier layer 1118 may directly encapsulate core 1110, followed by the conductive layer 1114 and subsequent adhesion layer 1116. In this embodiment, layer 920 may be directly deposited onto the adhesion layer 1116 from the top side. In yet another embodiment, the adhesion layer 1116 may be deposited on the core 1110, followed by a barrier layer 1118, and then followed by a conductive layer 1114, and another adhesion layer 1112.

Figure 12:
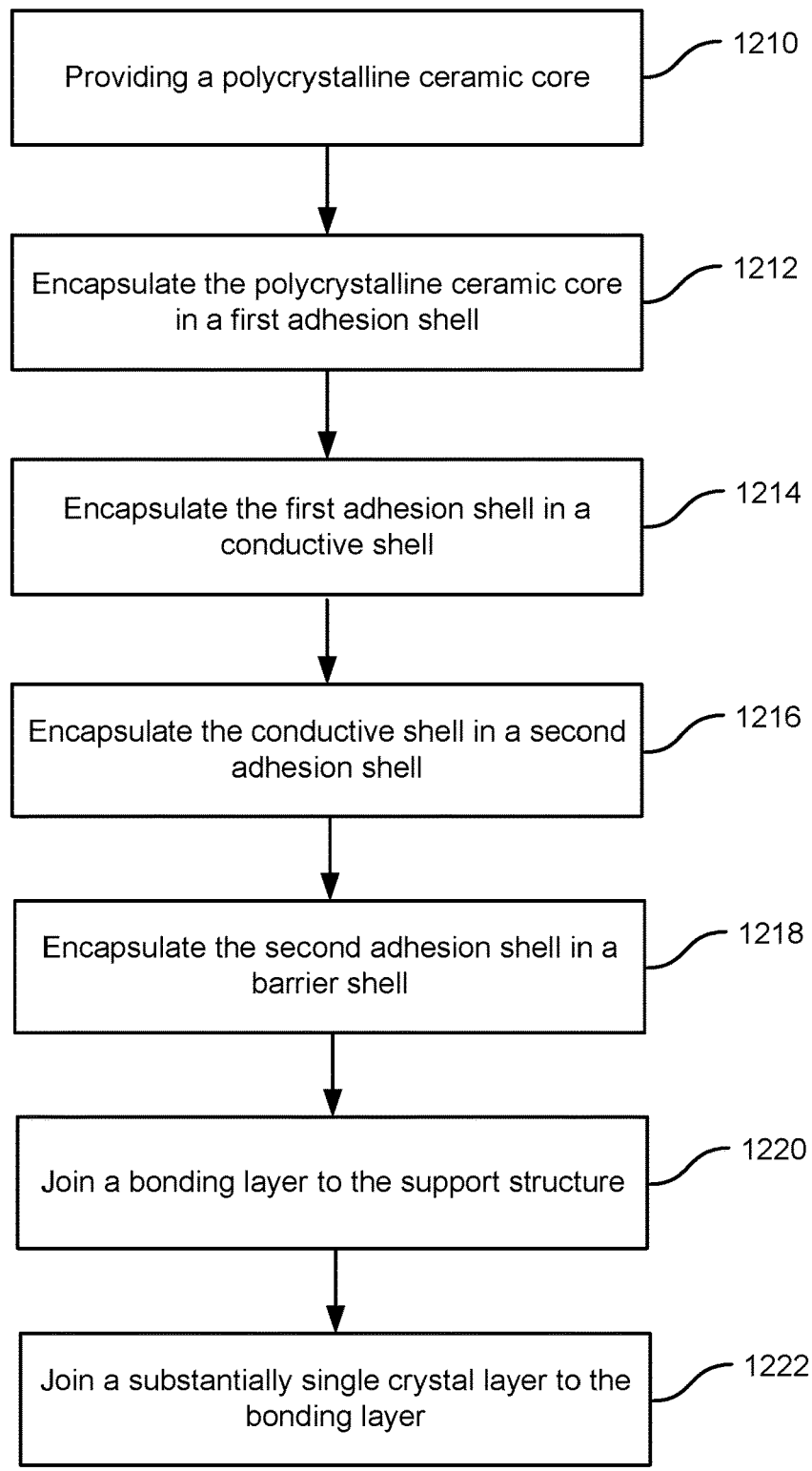
FIG. 12 is a simplified flowchart illustrating a method of fabricating an engineered substrate according to some embodiments of the present invention.

FIG. 12 is a simplified flowchart illustrating a method 1200 of fabricating an engineered substrate according to an embodiment of the present invention. The method 1200 can be utilized to manufacture a substrate that is CTE matched to one or more of the epitaxial layers grown on the substrate. The method 1200 includes forming a support structure by providing a polycrystalline ceramic core (1210), encapsulating the polycrystalline ceramic core in a first adhesion layer forming a shell (1212) (e.g., a tetraethyl orthosilicate (TEOS) oxide shell), and encapsulating the first adhesion layer in a conductive shell (1214) (e.g., a polysilicon shell). The first adhesion layer can be formed as a single layer of TEOS oxide. The conductive shell can be formed as a single layer of polysilicon.

The method 1200 also includes encapsulating the conductive shell in a second adhesion layer (1216) (e.g., a second TEOS oxide shell) and encapsulating the second adhesion layer in a barrier layer shell (1218). The second adhesion layer can be formed as a single layer of TEOS oxide. The barrier layer shell can be formed as a single layer of silicon nitride.

Once the support structure is formed by processes 1210-1218, the method 1200 further includes joining a bonding layer (e.g., a silicon oxide layer) to the support structure (1220) and joining a substantially single crystal layer, for example, a single crystal silicon layer, to the silicon oxide layer (1222). Other substantially single crystal layers can be used according to embodiments of the present invention, including SiC, sapphire, GaN, AlN, SiGe, Ge, Diamond, Ga$_2$O$_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 9, the bonding layer 920 can be formed by a deposition of a thick (e.g., 4 µm thick) oxide layer followed by a chemical mechanical polishing (CMP) process to thin the oxide to approximately 1.5 µm in thickness. The thick initial oxide serves to fill voids and surface features present on the support structure that may be present after fabrication of the polycrystalline core and continue to be present as the encapsulating layers illustrated in FIG. 9 are formed. The oxide layer also serves as a dielectric layer for the devices. The CMP process provides a substantially planar surface free of voids, particles, or other features, which can then be used during a wafer transfer process to bond the single crystal layer 922 (e.g., a single crystal silicon layer) to the bonding layer 920. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 922 (e.g., a single crystal silicon layer) to the bonding layer 920. In some embodiments, a silicon wafer including the substantially single crystal layer 922 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. The thickness of the single crystal layer 922 can be varied to meet the specifications of various applications. Moreover, the crystal orientation of the single crystal layer 922 can be varied to meet the specifications of the application. Additionally, the doping levels and profile in the single crystal layer can be varied to meet the specifications of the particular application. In some embodiments, the depth of the implant may be adjusted to be greater than the desired final thickness of single crystal layer 922. The additional thickness allows for the removal of the thin portion of the transferred substantially single crystal layer that is damaged, leaving behind the undamaged portion of the desired final thickness. In some embodiments, the surface roughness can be modified for high quality epitaxial growth. One of ordinary skill in the art would recognize many variations, modifications, and alternatives.

In some embodiments, the single crystal layer 922 can be thick enough to provide a high quality lattice template for the subsequent growth of one or more epitaxial layers but thin enough to be highly compliant. The single crystal layer 922 may be said to be "compliant" when the single crystal layer 922 is relatively thin such that its physical properties are less constrained and able to mimic those of the materials surrounding it with less propensity to generate crystalline defects. The compliance of the single crystal layer 922 may be inversely related to the thickness of the single crystal layer 922. A higher compliance can result in lower defect densities in the epitaxial layers grown on the template and enable thicker epitaxial layer growth. In some embodiments, the thickness of the single crystal layer 922 may be increased by epitaxial growth of silicon on the exfoliated silicon layer.

In some embodiments, adjusting the final thickness of the single crystal layer 922 may be achieved through thermal oxidation of a top portion of an exfoliated silicon layer, followed by an oxide layer strip with hydrogen fluoride (HF) acid. For example, an exfoliated silicon layer having an initial thickness of 0.5 µm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the single crystal layer during thermal oxidation can be stripped using HF acid etching. The etching selectivity between silicon oxide and silicon (SiO$_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for (SiO2:Si). A high etch selectivity may reduce the surface roughness by a similar factor from the initial surface roughness. However, the surface roughness of the resultant single crystal layer 122 may still be larger than desired. For example, a bulk Si (111) surface may have a root-mean-square (RMS) surface roughness of less than 0.1 nm as determined by a 2 µm×2 µm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 µm×30 µm AFM scan area.

If the surface roughness of the single crystal layer 922 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 12 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a semiconductor device, the method comprising:
    providing an engineered substrate including:
        a polycrystalline ceramic core;
        a barrier layer encapsulating the polycrystalline ceramic core;
        a bonding layer coupled to the barrier layer; and
        a substantially single crystalline silicon layer coupled to the bonding layer;
    forming a Schottky diode coupled to the engineered substrate, the Schottky diode having a top surface and a bottom surface, the bottom surface coupled to the substantially single crystalline silicon layer;
    forming a Schottky contact coupled to the top surface of the Schottky diode;
    forming a metal plating coupled to the Schottky contact;
    removing the engineered substrate to expose the bottom surface of the Schottky diode; and
    forming an ohmic contact on the bottom surface of the Schottky diode.

2. The method of claim 1 wherein the forming the Schottky diode comprises:
    forming a first epitaxial N-type gallium nitride layer coupled to the substantially single crystalline silicon layer, the first N-type gallium nitride layer having a first doping concentration; and
    forming a second epitaxial N-type gallium nitride layer coupled to the first epitaxial N-type gallium nitride layer, the second epitaxial N-type gallium nitride layer having a second doping concentration less than the first doping concentration;
    wherein the Schottky contact is coupled to the second epitaxial N-type gallium nitride layer, and the ohmic contact is coupled to the first epitaxial N-type gallium nitride layer.

3. The method of claim 1 wherein the metal plating has a thickness ranging from about 50 μm to about 100 μm.

4. The method of claim 1 wherein the polycrystalline ceramic core comprises polycrystalline aluminum gallium nitride (AlGaN).

5. The method of claim 1 wherein the substantially single crystalline silicon layer has a (111) surface orientation.

6. The method of claim 2 further comprising, before forming the first epitaxial N-type gallium nitride layer, forming a buffer layer coupled to the substantially single crystalline silicon layer, wherein the first epitaxial N-type gallium nitride layer is coupled to the buffer layer.

7. The method of claim 2 wherein the second epitaxial N-type gallium nitride layer has a thickness greater than about 10 μm.

8. The method of claim 2 wherein the second epitaxial N-type gallium nitride layer has a thickness greater than about 20 μm.

9. The method of claim 6 wherein the buffer layer comprises aluminum gallium nitride.

10. The method of claim 6 wherein the buffer layer comprises a plurality of layers including an aluminum nitride layer, an aluminum gallium nitride layer, and a gallium nitride layer.

11. A method of forming a semiconductor device, the method comprising:
    providing an engineered substrate including:
        a polycrystalline ceramic core;
        a barrier layer encapsulating the polycrystalline ceramic core;
        a bonding layer coupled to the barrier layer; and
        a substantially single crystalline silicon layer coupled to the bonding layer;
    forming a buffer layer coupled to the substantially single crystalline silicon layer;
    forming a power transistor coupled to the buffer layer, the power transistor having a top surface and a bottom surface, the bottom surface coupled to the buffer layer;
    forming a gate contact coupled to top surface of the power transistor;
    forming a first source contact and a second source contact coupled to the top surface of the power transistor;
    removing the engineered substrate;
    removing the buffer layer to expose the bottom surface of the power transistor; and
    forming a drain contact coupled to the bottom surface of the power transistor.

12. The method of claim 11 wherein forming the power transistor comprises:
    forming a first epitaxial N-type gallium nitride layer coupled to the buffer layer, the first N-type gallium nitride layer having a first doping concentration;
    forming a second epitaxial N-type gallium nitride layer coupled to the first epitaxial N-type gallium nitride layer, the second epitaxial N-type gallium nitride layer having a second doping concentration less than the first doping concentration;
    forming a first P-type gallium nitride region and a second P-type gallium nitride region within the second epitaxial N-type gallium nitride layer, the first P-type gallium nitride region and the second P-type gallium nitride region separated from each other by a trench, wherein a portion of the second epitaxial N-type gallium nitride layer above the trench forms a channel region;
    forming an epitaxial aluminum gallium nitride layer coupled to the channel region; and
    forming a gate dielectric layer coupled to the epitaxial aluminum gallium nitride layer;
    wherein the gate contact is coupled to the gate dielectric layer, the first source contact is coupled to the first P-type gallium nitride region, the second source contact is coupled to the second P-type gallium nitride region, and the drain contact is coupled to a back surface of the first epitaxial N-type gallium nitride layer.

13. The method of claim 11 wherein the polycrystalline ceramic core comprises polycrystalline aluminum gallium nitride (AlGaN).

14. The method of claim 11 the substantially single crystalline silicon layer has a (111) surface orientation.

15. The method of claim 11 wherein the buffer layer comprises aluminum gallium nitride.

16. The method of claim 11 wherein the buffer layer comprises a plurality of layers including an aluminum nitride layer, an aluminum gallium nitride layer, and a gallium nitride layer.

17. The method of claim 12 wherein forming the first P-type gallium nitride region and the second P-type gallium nitride region comprises implanting a first region and a second region of the second epitaxial N-type gallium nitride layer with a P-type dopant.

18. The method of claim 12 wherein forming the first P-type gallium nitride region and the second P-type gallium nitride region comprises:
   forming an epitaxial P-type gallium nitride layer on the second epitaxial N-type gallium nitride layer;
   removing a portion of the epitaxial P-type gallium nitride layer to form the trench exposing a portion of the second epitaxial N-type gallium nitride layer, the trench separating a remaining portion of the epitaxial P-type gallium nitride layer into the first P-type gallium nitride region and the second P-type gallium nitride region; and
   forming a regrowth epitaxial N-type gallium nitride layer over the exposed portion of the second epitaxial N-type gallium nitride layer and over the remaining portion of the epitaxial P-type gallium nitride layer.

19. The method of claim 12 wherein the second epitaxial N-type gallium nitride layer has a thickness greater than about 10 μm.

20. The method of claim 12 wherein the second epitaxial N-type gallium nitride layer has a thickness greater than about 20 μm.

* * * * *